United States Patent
Buckley et al.

(10) Patent No.: US 10,879,383 B2
(45) Date of Patent: Dec. 29, 2020

(54) HIGH ELECTRON MOBILITY TRANSISTOR AND METHOD OF FABRICATION HAVING REDUCED GATE LENGTH AND LEAK CURRENT

(71) Applicant: Commissariat A L'Energie Atomique et aux Energies Alternatives, Paris (FR)

(72) Inventors: Julien Buckley, Grenoble (FR); Matthew Charles, Grenoble (FR); Alphonse Torres, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/392,735

(22) Filed: Apr. 24, 2019

(65) Prior Publication Data
US 2019/0334022 A1    Oct. 31, 2019

(30) Foreign Application Priority Data
Apr. 25, 2018    (FR) ...................................... 18 53632

(51) Int. Cl.
*H01L 29/778*    (2006.01)
*H01L 29/207*    (2006.01)
(Continued)

(52) U.S. Cl.
CPC ...... *H01L 29/7786* (2013.01); *H01L 21/8232* (2013.01); *H01L 21/8234* (2013.01);
(Continued)

(58) Field of Classification Search
CPC ......... H01L 29/66431; H01L 29/66439; H01L 29/66446; H01L 29/66462; H01L 29/66469; H01L 29/66477; H01L 29/778; H01L 29/7781; H01L 29/7782; H01L 29/7783; H01L 29/7786;
(Continued)

(56) References Cited

U.S. PATENT DOCUMENTS 7,863,649 B2    1/2011  Hikita et al.
8,193,523 B2 *  6/2012  Pillarisetty ............ H01L 29/165
                                                               257/14

(Continued)

OTHER PUBLICATIONS

French Preliminary Search Report dated Jan. 31, 2019 in French Application 18 53632, filed on Apr. 25, 2018 (with English translation of categories of cited documents & Written Opinion).

*Primary Examiner* — Eduardo A Rodela
(74) *Attorney, Agent, or Firm* — Oblon, McClelland, Maier & Neustadt, L.L.P.

(57) ABSTRACT

A high-electron-mobility field-effect transistor includes a superposition of first and second layers of semiconductor materials so as to form an electron gas layer and includes a gate stack arranged on the superposition. The gate stack includes a conductive electrode and an element made of p-doped semiconductor material, arranged between the conductive electrode and the superposition. The gate stack includes a first dielectric layer arranged between the conductive electrode and the element made of semiconductor material. The element made of semiconductor material, the first dielectric layer, and the conductive electrode have aligned lateral flanks.

16 Claims, 2 Drawing Sheets

(51) Int. Cl.
   *H01L 29/66* (2006.01)
   *H01L 21/8232* (2006.01)
   *H01L 21/8234* (2006.01)
(52) U.S. Cl.
   CPC .... *H01L 21/823462* (2013.01); *H01L 29/207* (2013.01); *H01L 29/66431* (2013.01); *H01L 29/66439* (2013.01); *H01L 29/66462* (2013.01); *H01L 29/66469* (2013.01); *H01L 29/66477* (2013.01); *H01L 29/778* (2013.01); *H01L 2924/13064* (2013.01)
(58) Field of Classification Search
   CPC ....... H01L 2924/13064; H01L 21/8232; H01L 21/8234; H01L 21/823462
   See application file for complete search history.

(56) References Cited

U.S. PATENT DOCUMENTS

| | | | |
|---|---|---|---|
| 9,349,828 B2* | 5/2016 | Kanamura | H01L 29/66462 |
| 2009/0242873 A1* | 10/2009 | Pillarisetty | H01L 29/42316 257/24 |
| 2012/0068227 A1 | 3/2012 | Hikita et al. | |
| 2012/0086049 A1* | 4/2012 | Hwang | H01L 29/66462 257/194 |
| 2013/0043492 A1 | 2/2013 | Takizawa et al. | |
| 2013/0112986 A1 | 5/2013 | Hsiung et al. | |
| 2014/0077266 A1* | 3/2014 | Ramdani | H01L 29/513 257/194 |
| 2014/0077267 A1* | 3/2014 | Heo | H01L 29/66431 257/194 |
| 2014/0159117 A1* | 6/2014 | Taniguchi | H01L 29/4232 257/194 |
| 2014/0203288 A1* | 7/2014 | Hsiung | H01L 29/7787 257/76 |
| 2014/0264379 A1* | 9/2014 | Kub | H01L 29/41725 257/77 |
| 2016/0118489 A1 | 4/2016 | Hikita et al. | |
| 2017/0330944 A1* | 11/2017 | Baines | H01L 29/0843 |
| 2018/0061974 A1 | 3/2018 | Saito et al. | |
| 2018/0061975 A1 | 3/2018 | Tanaka | |
| 2018/0358458 A1* | 12/2018 | Iucolano | H01L 29/7786 |
| 2019/0198654 A1* | 6/2019 | Lin | H01L 29/42364 |

* cited by examiner

HIGH ELECTRON MOBILITY TRANSISTOR AND METHOD OF FABRICATION HAVING REDUCED GATE LENGTH AND LEAK CURRENT

The invention relates to high-electron-mobility field-effect transistors, in particular to normally-off high-electron-mobility field-effect transistors, and to their fabrication processes.

Numerous electronic applications now require an improvement in performance qualities, especially in on-board electronics intended for cars and ground-based means of transportation, in aeronautics, in medical systems or in home automation solutions, for example. These applications for the most part require high-power switches functioning in frequency ranges from a few tens of hertz to a few hundred hertz. Frequencies above one megahertz are encountered in some applications.

An alternative for power switches, in particular high-frequency power switches, is the use of high-electron-mobility field-effect transistors, which belong to the category of heterostructure field-effect transistors. Such a transistor includes the superposition of two semiconductor layers having different bandgaps which form a quantum well at their interface. Electrons are confined in this quantum well in order to form a two-dimensional electron gas. For reasons of high-voltage and temperature withstand, these transistors are chosen so as to exhibit a wide energy bandgap.

Among HEM transistors having a wide energy bandgap, transistors based on gallium nitride are very promising. The width of their energy bandgap results in a higher critical electric field compared to conventional electronic materials, in a high carrier saturation velocity and in good thermal and chemical stabilities. The breakdown field of gallium nitride can thus be greater than $2 \times 10^6$ V/cm, which makes it possible to easily produce compact transistors with breakdown voltages of greater than 600 V. With a lateral conduction transistor, the gate-drain breakdown voltage can easily be controlled by an appropriate distance between gate and drain. Furthermore, such transistors make possible very high current densities as a result of the very high electron mobility and the high electron density in the interfacial electron gas.

Document US2013/0043492 describes an example of a high-electron-mobility field-effect transistor structure. This structure comprises the superposition of a layer of undoped GaN and a layer of AlGaN so as to form a heterojunction, inducing an electron gas layer at their interface. Source and drain electrodes are electrically connected to the electron gas layer. A gate stack is arranged between the source electrode and the drain electrode. The gate stack include a metal gate electrode, arranged on a contact layer made of magnesium-doped GaN, itself arranged on a layer made of p-doped GaN, which is in turn arranged on a current-limiting layer. The current-limiting layer is arranged on the upper face of the AlGaN layer of the superposition forming the heterojunction.

The layer made of p-doped GaN is intended to interrupt the electron gas layer between the source electrode and the drain electrode in the absence of bias on the various electrodes. Such a configuration allows the transistor to be made a normally-off transistor, without it being necessary to produce a trench in the GaN layer forming the heterojunction.

Such a configuration allows gate leakages to be limited and thus the electrical consumption of the transistor to be limited or allows its gate control to be simplified.

However, such a configuration has a certain number of drawbacks. First, the leakage current through the gate is still notably higher than with other technologies. Second, producing the metal electrode on the lower layers of the stack results in alignment constraints therewith. These constraints lead to a gate stack being produced resulting in a relatively long gate length. Furthermore, the isolating capacity of the current-limiting layer is quite limited when the gate is negatively biased, and this current-limiting layer potentially results in holes being injected in the direction of the electron gas layer when the gate is positively biased.

The invention is targeted at overcoming one or more of these disadvantages. The invention thus pertains to a high-electron-mobility field-effect transistor, as defined in the appended claim 1.

The invention also relates to a process for fabricating a high-electron-mobility field-effect transistor such as defined in the appended claims.

The invention also relates to the alternative forms of the dependent claims. A person skilled in the art will understand that each of the characteristics of the alternative forms of the dependent claims can be independently combined with the characteristics of an independent claim, without, however, constituting an intermediate generalization.

Other features and advantages of the invention will become clearly apparent from the description thereof that is given hereinafter, by way of indication and without any limitation, with reference to the appended drawings, in which:

FIG. 1 is a schematic cross-sectional view of a transistor 1. The transistor 1 is a normally-off high-electron-mobility field-effect transistor.

Figure 1:
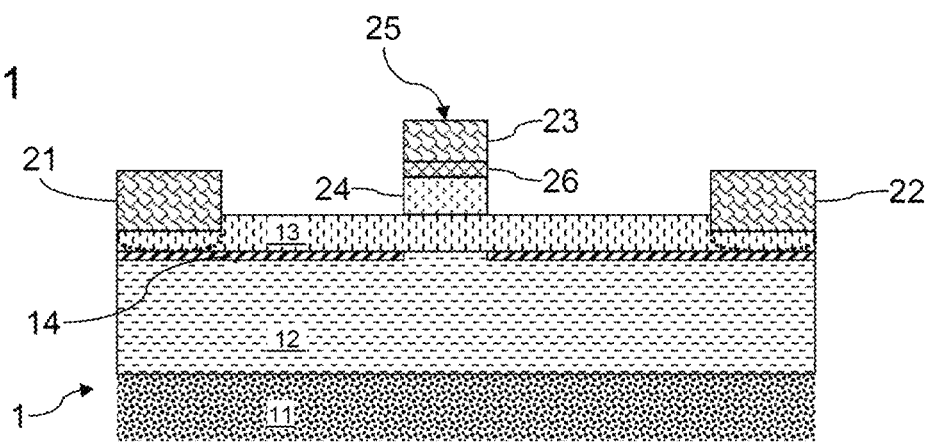
FIG. 1 is a schematic cross-sectional view of a transistor.

The transistor 1 is formed on a substrate 11. The substrate 11 may be surmounted by a matching layer and/or by a buffer layer, which are not illustrated here. The structure of the substrate 11 is known per se and is described in detail by way of illustration. The substrate 11 can be an insulator, an intrinsic or doped silicon-type semiconductor, SiC, sapphire or even AlN. The substrate 11 can typically exhibit a thickness of the order of 350 μm to 1.5 mm.

A superposition of layers 12 and 13 made of semiconductor material is arranged on the substrate 11, so as to form an electron gas layer. For the sake of legibility, the electron gas is illustrated here in the form of a layer 14.

The layer 12 is a channel layer. The layer 12 may be formed in a manner known per se of III-N semiconductor material, for example of GaN of not intentionally doped type. The thickness of this layer 12 may, for example, be between 50 nm and 2 μm, for example 100 nm.

The layer 13 is a barrier layer. The layer 13 may be formed in a manner known per se of III-N semiconductor material, so as to form the electron gas layer 14 at its interface with the channel layer 12. The barrier layer is for example made of $Al_xGa_{(1-x)}N$, of InAlN, of InGaAlN or of AlN, with a bandgap that is higher than that of the material of the layer 12. The thickness of the layer 13 may, for example, be between 3 and 30 nm, for example 25 nm. A layer of semiconductor material may be interposed between the layers 12 and 13, for example a layer of AlN with a thickness of 0.5 to 2 nm.

The transistor 1 includes a conduction electrode 21, making electrical contact with the electron gas layer 14. The formation of the electrical contact between the conduction electrode 21 and the electron gas layer 14 is known per se. The transistor 1 also includes a conduction electrode 22, remote from the conduction electrode 21, making electrical contact with the electron gas layer 14. The formation of the electrical contact between the conduction electrode 22 and the electron gas layer 14 is known per se.

A gate stack 25 is arranged on the layer 13. This gate stack 25 is arranged between the conduction electrodes 21 and 22 and is remote therefrom. The gate stack 25 may be insulated from the conduction electrodes 21 and 22 via a dielectric layer (not illustrated), which is arranged on the layer 13. The electron gas layer 14 extends continuously from the electrode 21 until approximately plumb with the vertical of the gate stack 25. The electron gas layer 14 also extends continuously from the electrode 22 until approximately plumb with the vertical of the gate stack 25.

Figure 2:
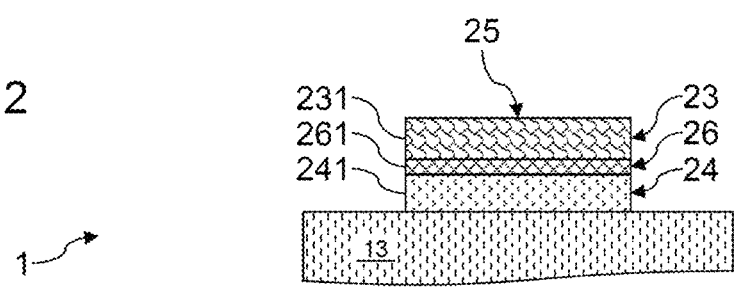
FIG. 2 is an enlarged schematic cross-sectional view of the transistor of FIG. 1 at the site of its gate stack.

An enlarged view of the gate stack 25 is illustrated in FIG. 2. The gate stack 25 comprises:
- a conductive electrode 23. The conductive electrode 23 may for example be made of TiN;
- an element 24 made of p-doped semiconductor material arranged below the conductive electrode 23. The element 24 made of semiconductor material is thus arranged between the conductive electrode and the layer 13. The element 24 is here arranged in contact with an upper face of the layer 13. The element 24 is for example doped with magnesium, typically at a chemical concentration of between $5*10^{18}$ cm$^{-3}$ and $1*10^{20}$ cm$^{-3}$. The thickness of the element 24 may typically be between 50 and 150 nm;
- a dielectric layer 26 arranged between the conductive electrode 23 and the element 24 made of semiconductor material. The thickness of the dielectric layer 26 is, preferably, between 3 and 20 nm, advantageously between 5 and 10 nm. The equivalent thickness of oxide of the layer 26 is advantageously between 1.5 and 10 nm, preferably between 2.5 and 5 nm. The layer 26 may for example be made of SiN, of $Si_3N_4$, HTO, of $Al_2O_3$ or of $HfO_2$.

The element 24 made of p-doped semiconductor material makes it possible, in a manner known per se, to form a depletion at the interface between the layers 12 and 13, below the gate stack 25. Thus, in the absence of bias on the electrodes 21 to 23, the transistor 1 is off.

The element 24 made of semiconductor material, the dielectric layer 26 and the conductive electrode 23 have aligned respective lateral flanks 241, 261 and 231. These lateral flanks are typically obtained by means of a fabrication process involving self-alignment. Thus, such a gate stack 25 may be produced without an alignment constraint on the various photolithography levels, which makes it possible to decrease the required gate length for the transistor 1 by ensuring good control thereof. The presence of the dielectric layer 26 in the gate stack 25 allows gate leakages to be decreased without however leading to an increase in the required gate length. The presence of the dielectric layer 26 also allows the p-type dopant concentration in the element 24 to be increased, by thus increasing the threshold voltage of the transistor 1 and the electrostatic control of the channel, and without leading to an increase in the gate leakage current.

Advantageously, the lateral flanks 241, 261 and 231 are flush with one another. The lateral flanks 241, 261 and 231 are here shown as vertical, however, depending on the chosen etching process, these lateral flanks may be inclined to a certain degree. The stack between the layer 26, the electrode 23 and the element 24 is in particular without steps.

Figure 6:
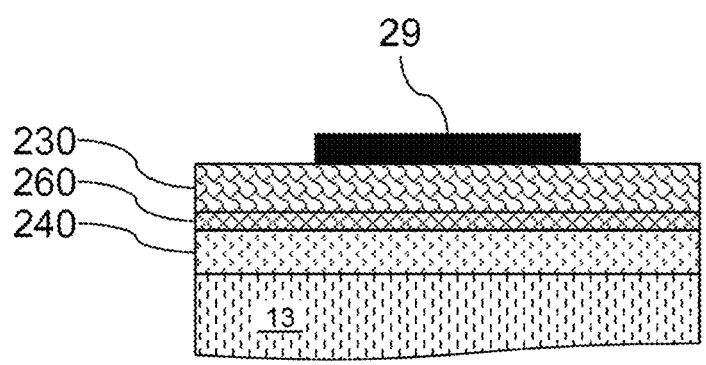
FIG. 6 is a schematic cross-sectional view of a stack of layers in one step of a process for fabricating a transistor.

FIG. 6 is a schematic cross-sectional view of a stack of layers in one step of a process for fabricating a transistor according to FIG. 1.

The layer 13 is here surmounted by a layer 240 of p-doped semiconductor material. The layer 240 may be deposited on the layer 13 by means of a process known per se. The layer 240 may be deposited by means of epitaxy, by holding in one and the same epitaxy reactor as for the formation of the layer 13.

The layer 240 is surmounted by a dielectric layer 260. The layer 260 may be produced by holding the substrate in one and the same epitaxy reactor as for the formation of the layer 240. It is possible for example to epitaxially deposit a layer 260 made of silicon nitride using a MOVPE or MOCVD (metalorganic vapour-phase epitaxy) process with a $SiH_4$ or $NH_3$ feed, for example with a growth rate of 100 nm/h. Such epitaxial growth may for example be achieved with a thermal budget of between 700 and 1100° C., preferably between 1000 and 1050° C., for example with a partial pressure of $NH_3$ between 6 and 10 mbar. The layer 260 may also be deposited outside an epitaxy reactor, by means of low-pressure chemical vapour deposition of $Si_3N_4$ or HTO, or by means of atomic layer deposition of $Al_2O_3$ or of $HfO_2$. Advantageously, SiN, $Si_3N_4$, or HTO will be used if later steps involve high thermal budgets, which risk altering the composition of the layer 260.

The layer 260 is surmounted by a conductive layer 230. The layer 230 is for example made of TiN. The layer 230 is for example deposited by means of a physical vapour deposition process.

The layer 230 is here surmounted by an etch mask 29 that is intended to define the geometry of the gate stack. Starting from the configuration in FIG. 6, one or more anisotropic etching steps are implemented to define the flanks 231, 261 and 241, and to expose the upper face of the layer 13 on either side of the stack. If the layer 240 is made of p-doped AlGaN and the layer 13 is made of AlGaN, the etching process may be relatively unselective between the layers 240 and 13 and require a slight bias (typically lower than 50 V). This may result in inclined flanks 241, which may negatively affect the on-state current of the transistor 1.

Figure 3:
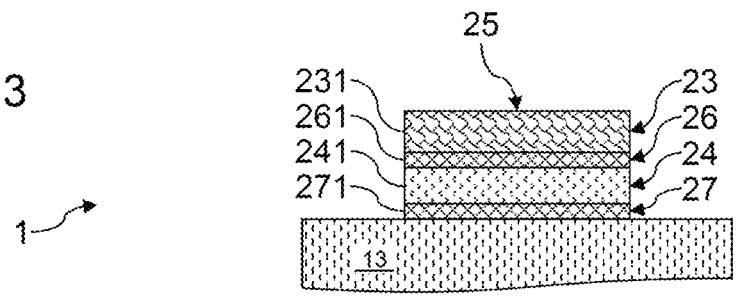
FIG. 3 is an enlarged schematic cross-sectional view of a transistor at the site of its gate stack.

FIG. 3 is an enlarged schematic cross-sectional view of another transistor 1 at the site of its gate stack 25. The transistor 1 is a normally-off high-electron-mobility field-effect transistor.

The transistor 1 is formed on a substrate 11, having for example characteristics that are identical to those described with reference to FIG. 1. A superposition of layers 12 and 13 made of semiconductor material is arranged on the substrate 11, so as to form an electron gas layer. The layers 12 and 13 may also be identical to those described with reference to FIG. 1.

The transistor 1 includes a conduction electrode 21 and a conduction electrode 22, for example identical to that described with reference to FIG. 1.

A gate stack 25 is arranged on the layer 13. This gate stack 25 is arranged between the conduction electrodes 21 and 22 and is remote therefrom. The gate stack 25 may be insulated from the conduction electrodes 21 and 22 via a dielectric layer (not illustrated), which is arranged on the layer 13. The electron gas layer 14 extends continuously from the electrode 21 until approximately plumb with the vertical of the gate stack 25. The electron gas layer 14 also extends continuously from the electrode 22 until approximately plumb with the vertical of the gate stack 25.

The gate stack 25 comprises:
- a conductive electrode 23. The conductive electrode 23 is for example identical to that of the first embodiment;
- an element 24 made of p-doped semiconductor material arranged below the conductive electrode 23. The element 24 is for example identical to that described with reference to FIG. 1;
- a dielectric layer 26 arranged between the conductive electrode 23 and the element 24 made of semiconductor material. The dielectric layer 26 is for example identical to that described with reference to FIG. 1;
- another dielectric layer 27 arranged between the element 24 and the layer 13.

The layer 27 may be made from the same material as the layer 26.

The layer 13 is exposed on either side of the gate stack 25: the layer 27 does not cover the layer 13 beyond the gate stack 25.

The element 24 made of p-doped semiconductor material makes it possible, in a manner known per se, to form a depletion at the interface between the layers 12 and 13, below the gate stack 25. Thus, in the absence of bias on the electrodes 21 to 23, the transistor 1 is off.

The element 24 made of semiconductor material, the dielectric layer 26, the dielectric layer 27 and the conductive electrode 23 have aligned respective lateral flanks 241, 261, 271 and 231. These lateral flanks are typically obtained by means of a fabrication process involving self-alignment. Thus, such a gate stack 25 may be produced without an alignment constraint on the various photolithography levels, which makes it possible to decrease the required gate length for the transistor 1. The presence of the dielectric layer 26 in the gate stack 25 allows gate leakages to be decreased without however leading to an increase in the required gate length. The presence of the dielectric layer 26 also allows the p-type dopant concentration in the element 24 to be increased, by thus increasing the threshold voltage of the transistor 1 and the electrostatic control of the channel, and without leading to an increase in the gate leakage current. The dielectric layer 27 advantageously makes it possible to limit the diffusion of the dopant from the element 24 during the deposition thereof.

Advantageously, the lateral flanks 241, 261, 271 and 231 are flush with one another. The lateral flanks 241, 261, 271 and 231 are here shown as vertical, however, depending on the chosen etching process, these lateral flanks may be inclined to a certain degree.

Figure 7:
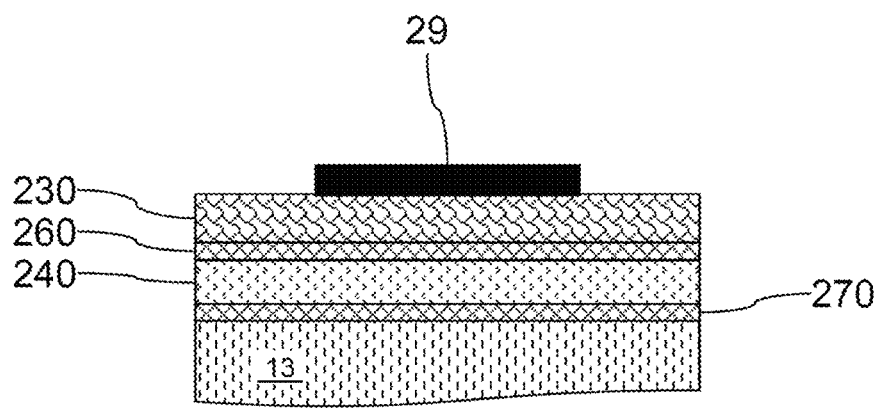
FIG. 7 is a schematic cross-sectional view of a stack of layers in one step of a process for fabricating a transistor such as illustrated in FIG. 3 or 4.

FIG. 7 is a schematic cross-sectional view of a stack of layers in one step of a process for fabricating a transistor described with reference to FIG. 3 (or with reference to FIG. 4 described below).

The layer 13 is here surmounted by a dielectric layer 270. The dielectric layer 270 may be deposited on the layer 13 by means of a process known per se. The process for depositing the layer 270 may be substantially identical to that described for the deposition of the layer 260 in the first embodiment. The thermal budget for the deposition of the layer 270 will advantageously be at most equal to the thermal budget for the deposition of a layer 240, which will be described below.

The layer 270 is here surmounted by a layer 240 of p-doped semiconductor material, for example identical to that described with reference to FIG. 6. The layer 240 may be deposited on the layer 13 by means of a process known per se. The layer 240 may be deposited by growth, by holding in one and the same epitaxy reactor as for the formation of the layer 13. The deposited layer 240 may be amorphous. The layer 240 made of AlGaN may for example be deposited with TMGa or TEGa, TMAl and $NH_3$. This deposition operation may for example take place at an epitaxial growth rate that is most equal to 1.4 μm/h. A partial pressure of $NH_3$ of 50 mbar may be used. The thermal budget for this growth may for example be between 500 and 1050° C. The layers 270 and 240 may also be produced outside of an epitaxy machine.

The layer 240 is surmounted by a dielectric layer 260. The layer 260 may be produced by holding the substrate in one and the same epitaxy reactor as for the formation of the layer 240. The layer 260 may also be produced outside of an epitaxy reactor. The process for depositing the layer 260 may be identical to that described with reference to FIG. 6.

The layer 260 is surmounted by a conductive layer 230. The layer 230 is for example made of TiN. The process for depositing the layer 230 may be identical to that described with reference to FIG. 6.

The layer 230 is here surmounted by an etch mask 29 that is intended to define the geometry of the gate stack. Starting from the configuration in FIG. 7, one or more anisotropic etching steps are implemented to define the flanks 231, 261, 241 and 271, and to expose the upper face of the layer 13 on either side of the stack. In relation to the etching process described with reference to FIG. 6, the etching of the layer 240 may be carried out with a higher bias, and hence the flanks 241 made more vertical, due to the presence of the layer 270 forming a stop layer. The etching of the layer 270 may be carried out with a lower bias, to avoid negatively affecting the subjacent layer 13.

Figure 4:
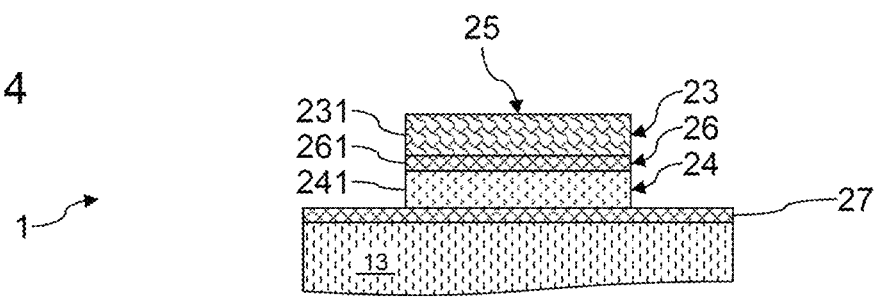
FIG. 4 is an enlarged schematic cross-sectional view of a transistor at the site of its gate stack.

FIG. 4 is an enlarged schematic cross-sectional view of another transistor 1 at the site of its gate stack 25. The transistor 1 differs here from that described with reference to FIG. 3 only in the structure of the dielectric layer 27. The dielectric layer 27 covers here the upper face of the layer 13 on either side of the gate stack 25. The dielectric layer 27 extends here laterally up to the conduction electrodes 21 and 22. In this configuration, the etching process allows the layer 13 not to be negatively affected, and further allows the dielectric layer 27 to be used to passivate this layer 13.

Figure 5:
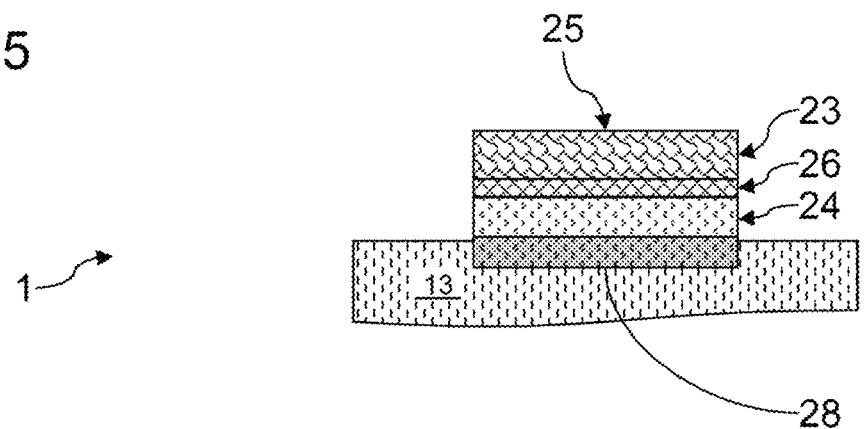
FIG. 5 is an enlarged schematic cross-sectional view of a transistor of FIG. 1 according to one variant, at the site of its gate stack.

FIG. 5 is an enlarged schematic cross-sectional view of a transistor according to one variant applied to the example described with reference to FIG. 1, at the site of its gate stack 25. In relation to the configuration illustrated in FIG. 1, an annealing operation for diffusing the dopant (for example magnesium) present in the element 24 towards the layer 13 is carried out after etching the flanks of the gate stack 25. The layer 13 (optionally the layer 12) thus includes a doped zone 28 (doped with magnesium in this example). The presence of dopants in the channel of the transistor 1 allows in particular its threshold voltage to be increased.

Such a dopant diffusion operation is also applicable to the examples described with reference to FIGS. 3 and 4. A diffusion anneal then allows the dopant to be diffused into the channel through the dielectric layer 27. Such doping of the channel through the dielectric layer 27 may be achieved, while avoiding diffusion of this dopant towards the accesses on either side of the gate stack 25, when depositing the element 24. For example, to diffuse Mg contained in an element 24 made of p-GaN through a layer 27 made of SiN into a channel made of GaN, it is possible to carry out an anneal at a temperature of between 1050° C. and 1300° C. It is also possible to envisage adding a protective layer to protect the surface of the circuit if it is desired to carry out an anneal at a higher temperature. The anneal times may then be between a few seconds for an annealing temperature of 1300° C. and several hours for an annealing temperature of 1050° C.

It is thus possible to obtain a configuration corresponding to the examples described with reference to FIGS. 3 and 4, in which the concentration of p-dopant in the channel formed in the layer 13 below the stack 25 is at least five times higher than the concentration of p-dopant in the accesses formed in the layer 13 on either side of the gate stack 25.

In the various illustrated configurations, the layer 13 advantageously has a flat surface extending between the conduction electrodes 21 and 22 and making contact with the gate stack 25. The gate stack 25 is thus not formed in a recess in the layer 13, which has a positive effect on the conduction of the transistor 1 in the on state while only minimally negatively affecting the conduction properties of the layer 14.

The invention claimed is:

1. A high-electron-mobility field-effect transistor, comprising:
    a superposition of first and second layers of semiconductor materials so as to form an electron gas layer;
    a gate stack arranged on said superposition, said gate stack comprising
        a conductive electrode;
        a layer made of p-doped semiconductor material, arranged between said conductive electrode and said superposition; wherein
    the gate stack comprises a first dielectric layer arranged between said conductive electrode and said layer made of p-doped semiconductor material;
    the gate stack comprises a second dielectric layer arranged between the layer made of p-doped semiconductor material and said superposition, such that the second dielectric layer is separated from the first dielectric layer by the layer made of p-doped semiconductor material; and
    the conductive electrode, the layer made of p-doped semiconductor material, and the first dielectric layer have self-aligned lateral flanks formed by etching.

2. The high-electron-mobility field-effect transistor according to claim 1, wherein the lateral flanks of the layer made of p-doped semiconductor material, of said first dielectric layer and of said conductive electrode are flush with one another.

3. The high-electron-mobility field-effect transistor according to claim 1, wherein thickness of said first dielectric layer is equivalent to a thickness of oxide of between 1.5 and 10 nm.

4. The high-electron-mobility field-effect transistor according to claim 1, wherein the second layer of semiconductor material is closest to the layer made of p-doped semiconductor material and includes the same p-type dopant as said layer made of p-doped semiconductor material below said gate stack.

5. The high-electron-mobility field-effect transistor according to claim 1, wherein said second dielectric layer extends laterally up to first and second conduction electrodes that are arranged on either side of the gate stack and electrically connected to the electron gas layer.

6. The high-electron-mobility field-effect transistor according to claim 5, wherein said second layer of semiconductor material makes contact woth said gate.

7. The high-electron-mobility field-effect transistor according to claim 1, wherein a thickness of said second dielectric layer is equivalent to a thickness of oxide of between 1.5 and 10 nm.

8. The high-electron-mobility field-effect transistor according to claim 1, wherein the semiconductor materials of the first and second layers of the superposition are made of different alloys of III-N materials.

9. A process for fabricating a high-electron-mobility field-effect transistor, comprising:
    providing a superposition of first and second layers of semiconductor materials so as to form an electron gas layer and a stack of layers arranged on said superposition, said stack of layers comprising
    a conductive layer;
    a layer made of p-doped semiconductor material, arranged between the conductive layer and said superposition;
    a first dielectric layer arranged between said conductive layer and said layer made of p-doped semiconductor material; and
    a second dielectric layer arranged between said layer made of p-doped semiconductor material and said superposition, such that the second dielectric layer is separated from the first dielectric layer by the layer made of p-doped semiconductor material;
    etching said stack so as to form self-aligned lateral flanks of the conductive layer, of the layer made of p-doped semiconductor material, and of the first dielectric layer.

10. The process according to claim 9, wherein said etching is interrupted over said second dielectric layer.

11. The process according to claim 9, wherein said etching is interrupted over said superposition of first and second layers of semiconductor materials.

12. The process according to claim 9, further comprising an annealing step for diffusing p-type dopant from said layer made of p-doped semiconductor material towards said second layer of semiconductor material.

13. The process according to claim 12, wherein temperature of the annealing step for diffusing the p-type dopant is between 1050 and 1300° C.

14. The process according to claim 9, wherein the layer made of p-doped semiconductor material and the first dielectric layer are deposited by epitaxy in a same deposition chamber.

15. The process according to claim 9, wherein the first dielectric layer is formed of one or more of SiN, $Si_3N_4$, or HTO.

16. The process according to claim 9, wherein a top one of the first and second layers has a flat surface extending between conduction electrodes positioned on either side of the stack of layers, such that the stack of layers is arranged directly on the flat surface.

* * * * *

UNITED STATES PATENT AND TRADEMARK OFFICE
CERTIFICATE OF CORRECTION

PATENT NO. : 10,879,383 B2
APPLICATION NO. : 16/392735
DATED : December 29, 2020
INVENTOR(S) : Julien Buckley et al.

Page 1 of 1

It is certified that error appears in the above-identified patent and that said Letters Patent is hereby corrected as shown below:

In the Claims

Column 8, Claim 6, Line 6, delete "woth said gate" and insert -- with said gate stack, said second layer of semiconductor material having a flat surface extending between the first and second conduction electrodes and making contact with said gate stack --, therefor.

Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office*